United States Patent
Zheng et al.

(10) Patent No.: US 7,643,300 B1
(45) Date of Patent: Jan. 5, 2010

(54) HEAT DISSIPATION DEVICE FOR MEMORY MODULE CARDS

(75) Inventors: Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/336,482

(22) Filed: Dec. 16, 2008

(51) Int. Cl.
*H05K 7/20* (2006.01)
*G06F 1/20* (2006.01)

(52) U.S. Cl. ............... 361/716; 361/704; 361/709; 361/710; 361/721; 361/679.54; 165/80.3; 165/185; 174/16.3

(58) Field of Classification Search ............ 361/679.46, 361/679.52–679.54, 709–710, 715–716, 361/720–721; 165/80.3, 104.33, 185; 174/16.3
See application file for complete search history.

(56) References Cited

U.S. PATENT DOCUMENTS

| | | | | |
|---|---|---|---|---|
| 7,023,701 B2 * | 4/2006 | Stocken et al. | ............... | 361/704 |
| 7,286,355 B2 * | 10/2007 | Cheon | ............... | 361/699 |
| 7,339,793 B2 * | 3/2008 | Foster et al. | ............... | 361/721 |
| 7,365,990 B2 * | 4/2008 | RaghuRam | ............... | 361/720 |
| 7,460,373 B2 * | 12/2008 | Nagahashi | ............... | 361/704 |
| 2006/0104035 A1 * | 5/2006 | Vasoya et al. | ............... | 361/704 |
| 2008/0259567 A1 * | 10/2008 | Campbell et al. | ............ | 361/699 |
| 2008/0278916 A1 * | 11/2008 | Hsieh | ............... | 361/711 |
| 2009/0190303 A1 * | 7/2009 | Chu et al. | ............... | 361/679.47 |

FOREIGN PATENT DOCUMENTS

DE 102005035387 A1 * 2/2007

* cited by examiner

*Primary Examiner*—Jayprakash N Gandhi
*Assistant Examiner*—Robert Hoffberg
(74) *Attorney, Agent, or Firm*—Frank R. Niranjan

(57) ABSTRACT

A heat dissipation device used for removing heat from a plurality of memory module cards, includes a first bracket, a second bracket placed on the first bracket and a fin set arranged on the second bracket. The first bracket has a plurality of first sheets extending downwardly from a bottom thereof and defines a plurality of slots therein. The second bracket has a plurality of second sheets extending downwardly from a bottom thereof. The first sheets are respectively attached to sides of the memory module cards. The second sheets are respectively extended through the slots of the first bracket and attached to opposite sides of the memory module cards and opposite to the first sheets.

18 Claims, 5 Drawing Sheets ly illus- # HEAT DISSIPATION DEVICE FOR MEMORY MODULE CARDS

BACKGROUND OF THE INVENTION

1. Field of the Invention

The present invention relates to heat dissipation devices and particularly a heat dissipation device for memory module cards to dissipate heat generated by the cards.

2. Description of Related Art

Computers use numerous memory units such as Dynamic Random Access Memory units (DRAMs) for the storage and retrieval of data. Initially, individual memory units were mounted directly onto the computer main board, generally known as the mother board or system board. However, with increased size and complexity, computers and their system boards could not easily accommodate sufficient memory units. An early solution to this problem was to create a memory module, known as Single In-Line Memory Module (SIMM), that was formed of a plurality of individual memory units arranged in banks and mounted on a card in electronic connection to terminal pads adjacent to a longitudinal edge of the card.

Still higher memory demands in the systems were met by the development of so-called Dual In-Line Memory Modules (DIMMs) having individual memory units mounted in a card in electrical connection to terminal pads on both sides of the card edge to thereby accommodate more memory units.

As computer continues to advance in complexity, more memory module cards are required to be mounted in a computer. Simultaneously, the computer is required to be smaller and more portable. Under these two contradicting conditions, the conventional cooling structure is no longer able to satisfy the heat dissipation requirement of the memory module cards.

Accordingly, what is needed is a heat dissipation device allowing computer memory module cards to be densely assembled while still providing the necessary heat dissipation capability to the memory module cards.

SUMMARY OF THE INVENTION

A heat dissipation device for removing heat from a plurality of densely arranged memory module cards, includes a first bracket, a second bracket placed on the first bracket and a fin set arranged on the second bracket. The first bracket has a plurality of first sheets extending downwardly from a bottom thereof and defines a plurality of slots therein, adjacent to the first sheets, respectively. The second bracket has a plurality of second sheets extending downwardly from a bottom thereof. The first sheets are respectively attached to sides of the memory module cards. The second sheets are respectively extended through the slots of the first bracket and attached to opposite sides of the memory module cards and opposite to the first sheets.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
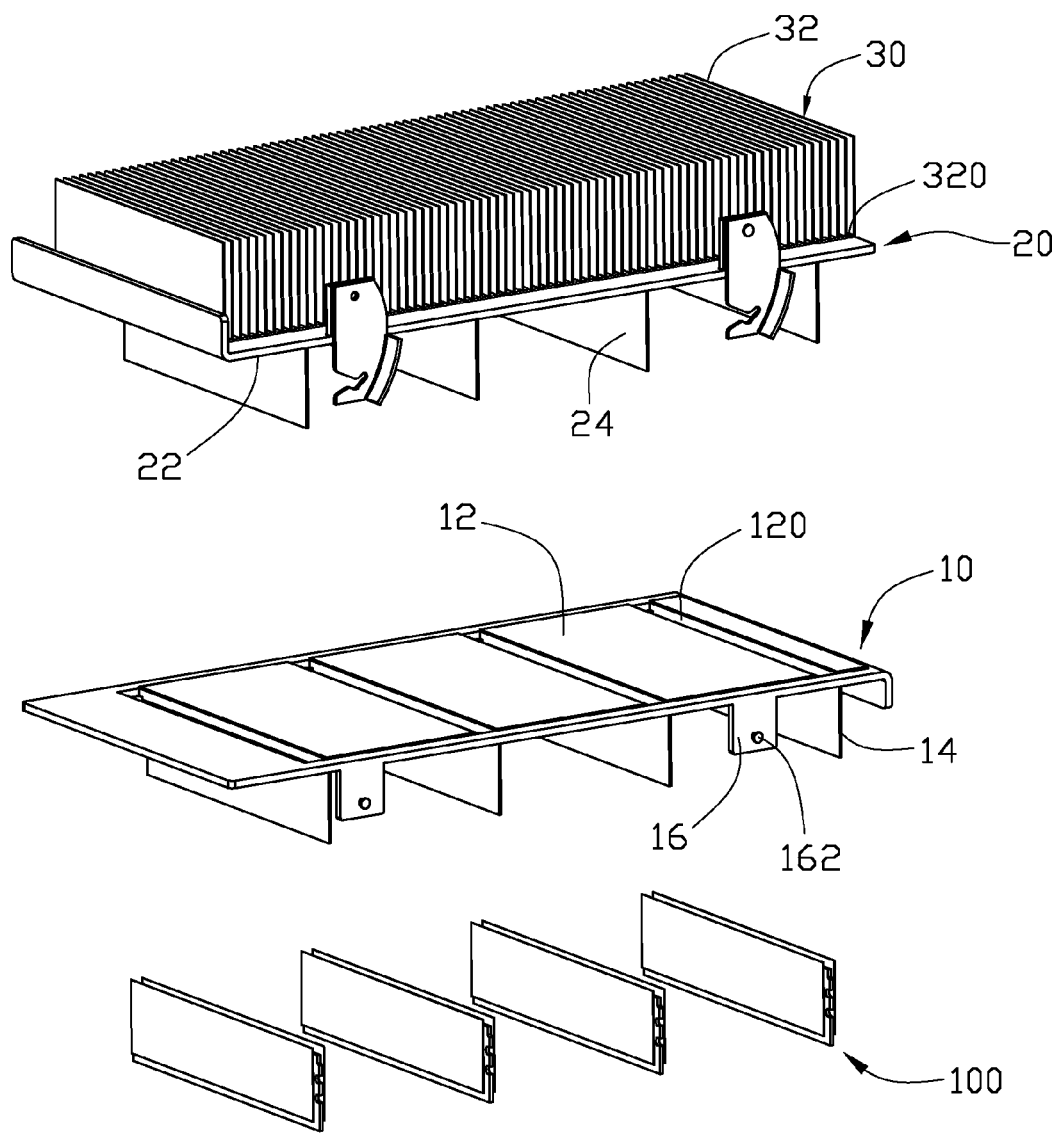
FIG. 1 is an isometric, exploded view of a heat dissipation device in accordance with a preferred embodiment of the disclosure and memory module cards.

Referring to FIG. 1, a heat dissipation device in accordance with a preferred embodiment is illustrated. The heat dissipation device for removing heat from a plurality of memory module cards 100 mounted on a main board (not shown) of a computer system (not shown), includes a base and a fin set 30 arranged on the base.

Figure 2:
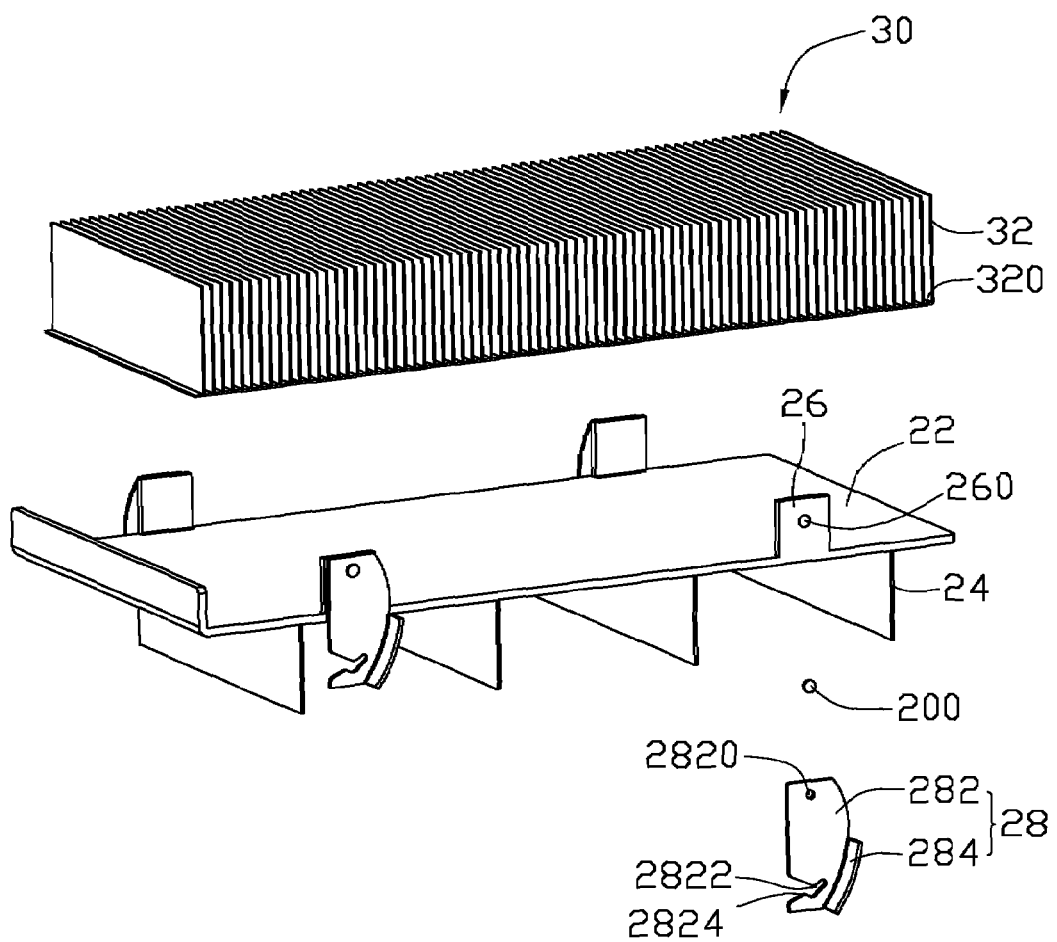
FIG. 2 is an exploded view of a second bracket of the heat dissipation device of FIG. 1.

Also referring to FIG. 2, the base comprises a first bracket 10 attached to lateral sides of the memory module cards 100 and a second bracket 20 attached to opposite lateral sides of the memory module cards 100. The bracket 10 comprises a first plate 12, a plurality of first sheets 14 extending downwardly from a bottom surface of the first plate 12 and two pairs of first retaining boards 16 respectively extending downwardly from two opposite longitudinal edges thereof. The first retaining boards 16 are perpendicular to the first sheets 14. The first plate 12 which is rectangular, is perpendicular to the first sheets 14 and defines a plurality of elongated slots 120 therein respectively adjacent the first sheets 14 and extending along longitudinal edges of the first sheets 14. The first sheets 14 and the slots 120 are all perpendicular to the longitudinal edges of the first plate 12. Each first sheet 14 is attached to one side of a corresponding memory module card 100. Two neighboring first sheets 14 are spaced from each other with a distance consistent with that between the corresponding memory module cards 100. The first sheets 14 are perpendicular to the first plate 12. Each pair of the first retaining boards 16 are located at the same side of the first plate 12 and are perpendicular to the first plate 12 and the first sheets 14. Each first retaining board 16 has a locking post 162 extending outwardly from an outer side thereof and located adjacent to a lower end thereof.

The second bracket 20 is closely rested on the first bracket 10 and comprises a second plate 22 placed on the first plate 12, a plurality of second sheets 24 extending downwardly from a bottom surface of the second plate 22, two pairs of second retaining boards 26 respectively extending upwardly from two opposite longitudinal edges of the second plate 22 and two pairs of locking members 28 for tightly fastening the first and second plates 12, 22 together. The second plate 22 has a shape similar to the first plate 12. The second sheets 24 perpendicular to the second plate 22. Two neighboring second sheets 24 are spaced from each other with a distance consistent with that between neighboring two of the first sheets 14. Each second sheet 24 is extended through a corresponding slot 120 of the first plate 12 and attached to an opposite side of a corresponding memory module card 100 and opposite to a corresponding first sheet 14, whereby the memory module card 100 is closely sandwiched between the corresponding first and second sheets 14, 24. The two pairs of the second retaining boards 26 are perpendicular to the second plate 22 and arranged respectively in alignment with the two pairs of the first retaining boards 16. Each second retaining board 26 defines a retaining hole 260 therein and located adjacent to a lower end thereof for engagingly receiving a bolt 200 extending through a corresponding locking member 28.

The locking members 28 engage with the first and second retaining boards 16, 26 to couple the first and second plates 12, 22 together. Each locking member 28 comprises a locking board 282 and a handling flange 284 extending outwardly from a lateral edge of the locking board 282. Each locking board 282 has a linear longitudinal edge and a curved edge opposite to the linear edge. Each locking board 282 defines a through hole 2820 therein adjacent to an upper end thereof and an engaging notch 2822 recessing inwardly from the linear edge thereof. The engaging notch 2822 is located adjacent to a lower end of the locking board 282 and inwardly decreases in width. The locking board 282 has a protruding tab 2824 projecting inwardly into the engaging notch 2822 from a lower inner edge thereof and adjacent to the opening of the engaging notch 2822 so as to hold the locking post 162 of the first retaining board 16 of the first bracket 10 in the engaging notch 2822 when the locking post 162 is received in the notch 2822. The handling flanges 284 are used for facilitating rotation of the locking members 28 relative to the bolts 200 and each handling flange 284 is extending perpendicularly from a lower portion of the curved edge of the locking board 282.

To assemble the locking members 28 to the second bracket 20, the bolts 200 are respectively extended through the through holes 2820 of the locking members 282 and then inserted into the retaining holes 260 of the second retaining boards 26 of the second bracket 20 to thus pivotally mount the locking members 28 on the second retaining boards 26 of the second bracket 20, respectively.

The fin set 30 is secured on a top surface of the second plate 22 of the second bracket 20 by soldering or adhering and comprises a plurality of fins 32. The fins 32 are spaced from each other with a constant distance and perpendicular to the longitudinal edges of the second plate 22 of the second bracket 20. Each fin 32 has a flange 320 extending perpendicularly from a lower end thereof. All of the flanges 320 cooperate with each other to define a contacting plate in a bottom of the fin set 30, which is directly attached to the top surface of the second plate 22 of the second bracket 20.

Figure 3:
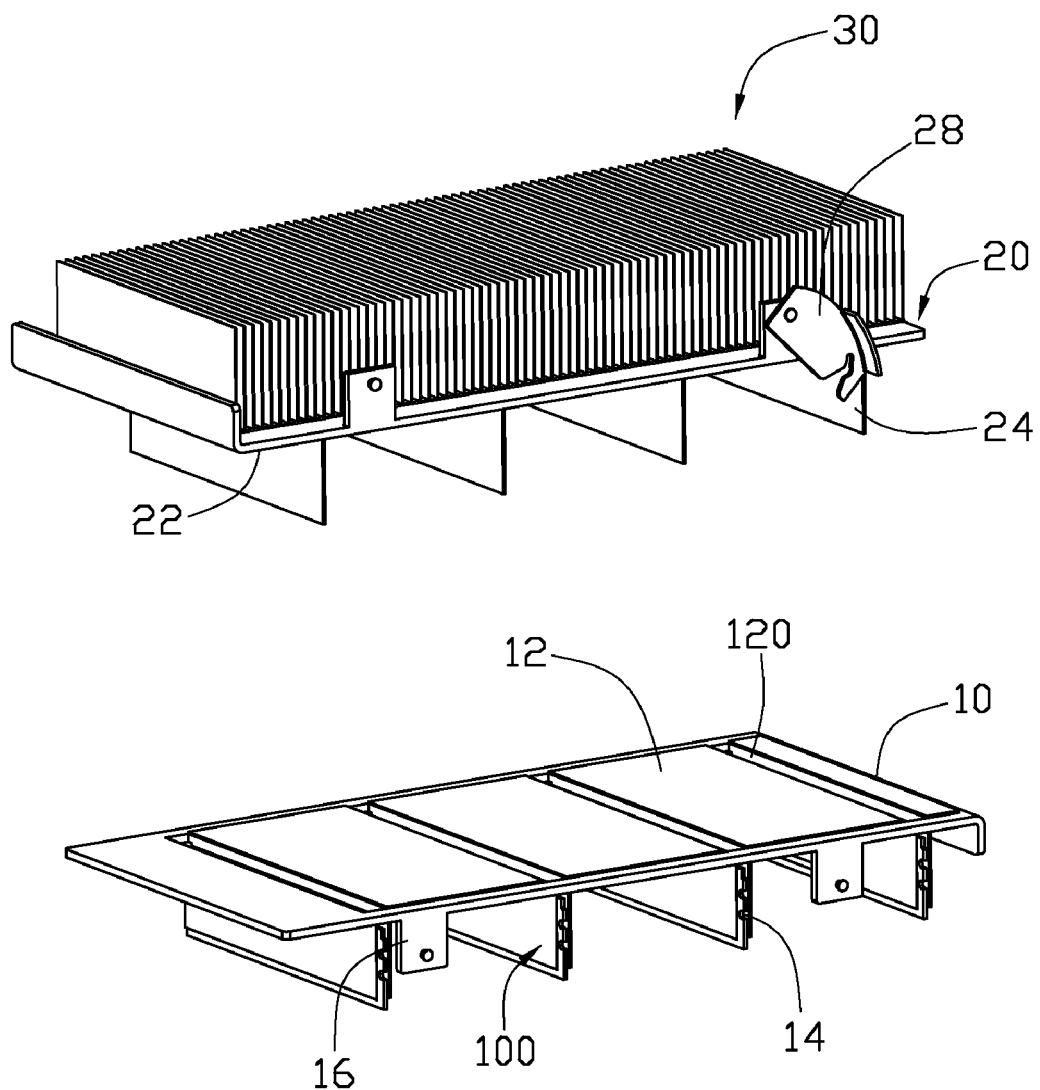
FIG. 3 is a partially assembled view of the heat dissipation device of FIG. 1, pre-assembled to the memory module cards.
Figure 4:
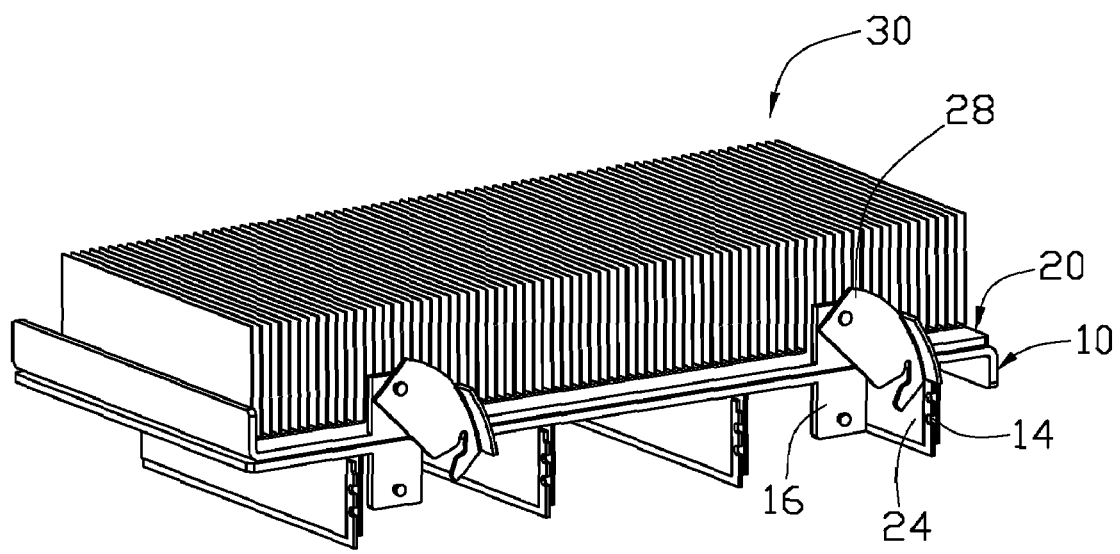
FIG. 4 is a further partially assembled view of the heat dissipation device and the member module cards of FIG. 3.
Figure 5:
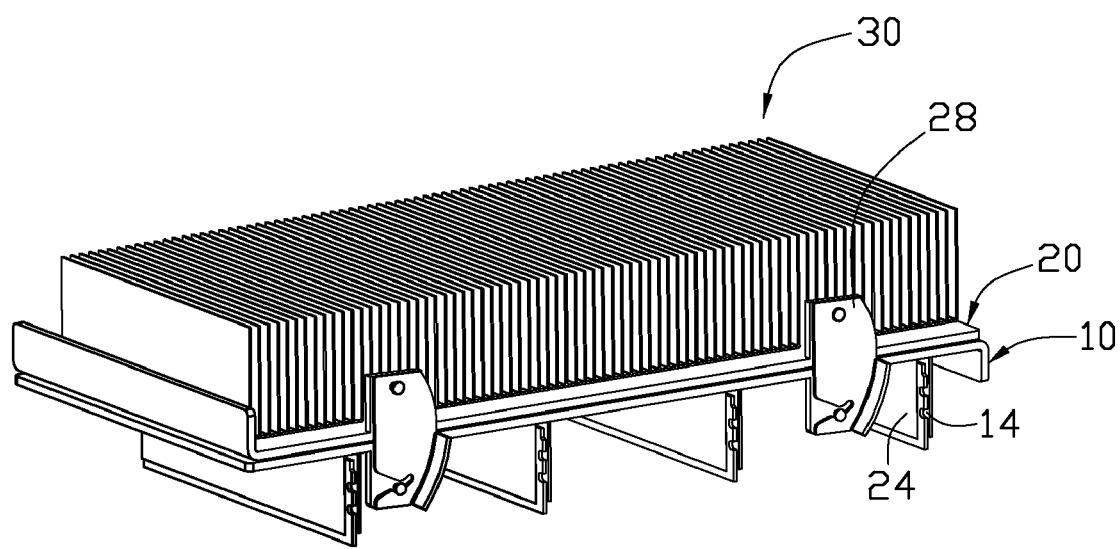
FIG. 5 is an assembled view of the heat dissipation device of FIG. 1 and the memory module cards.

Referring to FIGS. 3 to 5 particularly, to assemble the heat dissipation device to the memory module cards 100, the first bracket 10 is placed on the memory module cards 100 with the first sheets 14 respectively abutting against the sides of the memory module cards 100. The second bracket 20 is then brought to assemble with the first bracket 10 with the second plate 22 of the second bracket 20 positioned on the first plate 12 of the first bracket 10 and the second sheets 24 being respectively extended through the slots 120 of the first plate 12 to abut against the opposite sides of the memory module cards 100 and be opposite to the first sheets 14. The assembly is finally completed by operating the handling flanges 284 of the locking members 28 to rotate downwardly to engagingly receive the locking posts 162 of the first bracket 10.

In use of the heat dissipation device, heat generated by the memory module cards 100 is absorbed by the first and second sheets 14, 24 and distributed over the fin set 30 via the first and second plates 12, 22 to be effectively dissipated into ambient air. As the first, second brackets 10, 20 and the fin set 30 are all located above the memory module cards 100, no additional spacing between the memory module cards 100 is required to accommodate the heat dissipation device, particularly the fins of the heat dissipation device; thus the heat dissipation device can not only provide the memory module cards 100 with satisfactory heat dissipation but also allow the memory module cards 100 to be densely arranged.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for removing heat from a plurality of memory module cards, comprising:
   a first bracket comprising
      a first horizontal member,
      a plurality of first sheets extending downwardly from a bottom of the first horizontal member, and
      a plurality of through slots defined in the first horizontal member, each of the slots adjacent to a respective one of the first sheets;
   a second bracket placed on the first bracket, the second bracket comprising
      a second horizontal member, and
      a plurality of second sheets extending downwardly from a bottom of the second horizontal member; and
   a fin set arranged on the second bracket;
   wherein the first sheets of the first bracket are adapted for being respectively attached to sides of the memory module cards, the second sheets are respectively extended through the slots of the first bracket and adapted for being attached to opposite sides of the memory module cards and opposite to the first sheets.

2. The heat dissipation device as claimed in claim 1, further comprising a plurality of locking members, wherein the locking members are located at two opposite sides of the first and second brackets and fasten the first and second brackets together.

3. The heat dissipation device as claimed in claim 2, wherein the first bracket has a plurality of first retaining boards extending downwardly from the opposite edges thereof and a locking post extending outwardly from a corresponding first retaining board, the second bracket having a plurality of second retaining boards extending upwardly from two opposite edges thereof and respectively located in alignment with the first retaining boards.

4. The heat dissipation device as claimed in claim 3, wherein the locking members each comprise a locking board having an upper end pivotally connected to a corresponding second retaining board of the second bracket and a lower end engaging with the locking post of a corresponding first retaining board of the first bracket, and a handling flange extending outwardly from a side edge of each of the locking boards.

5. The heat dissipation device as claimed in claim 4, wherein each locking board defines an engaging notch in an edge of the locking board opposite to the handling flange by recessing inwardly from the edge of the locking board, for engagingly receiving a corresponding locking post of the first bracket.

6. The heat dissipation device as claimed in claim 5, wherein the engaging notch is located adjacent to a lower end of the locking board, and inwardly decreases in width, a protruding tab projecting inwardly into the engaging notch from a lower inner edge thereof and adjacent the opening of the engaging notch so as to hold the locking post of the corresponding first retaining board of the first bracket in the engaging notch.

7. The heat dissipation device as claimed in claim 1, wherein the first and second sheets are all perpendicular to the first and second brackets.

8. The heat dissipation device as claimed in claim 1, wherein the first and second brackets respectively comprise a first plate and a second plate, the second plate being placed on the first plate, and wherein the slots are defined in the first plate.

9. The heat dissipation device as claimed in claim 8, wherein the slots are perpendicular to longitudinal edges of the first plate, elongated and respectively located adjacent the first sheets and extend along longitudinal edges of the first sheets.

10. The heat dissipation device as claimed in claim 1, wherein the fin set comprises a plurality of fins having flanges extending perpendicularly from lower ends thereof and cooperatively with each other to define a plate contacting with a top surface of the second bracket.

11. A heat dissipation device for removing heat from a plurality of memory module cards, comprising:
   a first bracket comprising
      a first horizontal member,
      a plurality of first sheets extending downwardly from a bottom of the first horizontal member, and
      a plurality of through slots defined in the first horizontal member, each of the slots adjacent to a respective one of the first sheets;
   a second bracket placed on the first bracket, the second bracket comprising
      a second horizontal member, and
      a plurality of second sheets extending downwardly from a bottom of the second horizontal member and through the slots of the first bracket respectively; and
   a fin set arranged on the second bracket;
   wherein each memory module card is sandwiched between corresponding first and second sheets.

12. The heat dissipation device as claimed in claim 11, further comprising a plurality of locking members located at two opposite sides of the first and second brackets and fastening the two brackets together.

13. The heat dissipation device as claimed in claim 12, wherein the first bracket has a plurality of first retaining boards extending downwardly from the opposite edges thereof and a plurality of locking posts extending outwardly from corresponding first retaining boards, the second bracket having a plurality of second retaining boards extending upwardly from two opposite edges thereof and respectively arranged in alignment with the first retaining boards.

14. The heat dissipation device as claimed in claim 13, wherein the locking members each comprise a locking board having an upper end pivotally connected to a corresponding second retaining board of the second bracket and a lower end engaging with the locking post of a corresponding first retaining board of the first bracket, and a handling flange extending outwardly from a side edge of the locking board.

15. The heat dissipation device as claimed in claim 14, wherein each locking board defines an engaging notch in an edge of the locking board opposite to the handling flange by recessing inwardly from the edge of the locking board, for engagingly receiving a corresponding locking post of the first bracket therein.

16. The heat dissipation device as claimed in claim 15, wherein the engaging notch is located adjacent to a lower end of the locking board, and inwardly decreases in width, a protruding tab projecting inwardly into the engaging notch from a lower inner edge thereof and adjacent the opening of the engaging notch so as to hold the corresponding locking post of the first retaining board of the first bracket in the engaging notch.

17. The heat dissipation device as claimed in claim 11, wherein the first and second brackets respectively comprise a first plate and a second plate, the second plate being placed on the first plate, and wherein the slots are defined in the first plate.

18. The heat dissipation device as claimed in claim 17, wherein the slots are perpendicular to longitudinal edges of the first plate, elongated and respectively located adjacent to the first sheets and extend along longitudinal edges of the first sheets.

\* \* \* \* \*